(12) United States Patent
Panis et al.

(10) Patent No.: US 7,668,235 B2
(45) Date of Patent: Feb. 23, 2010

(54) JITTER MEASUREMENT ALGORITHM USING LOCALLY IN-ORDER STROBES

(75) Inventors: Michael Panis, Somerville, MA (US); Steve Munroe, Lakeway, TX (US); John Pane, Tigard, OR (US)

(73) Assignee: Teradyne, Boston, MA (US)

( * ) Notice: Subject to any disclaimer, the term of this patent is extended or adjusted under 35 U.S.C. 154(b) by 635 days.

(21) Appl. No.: 11/271,507

(22) Filed: Nov. 10, 2005

(65) Prior Publication Data

US 2007/0118315 A1 May 24, 2007

(51) Int. Cl.
*H04B 3/46* (2006.01)
*H04B 17/00* (2006.01)
*H04Q 1/20* (2006.01)

(52) U.S. Cl. .................. 375/226; 375/371; 702/69; 324/750; 324/755; 324/759; 324/763; 324/764

(58) Field of Classification Search ............. 375/371, 375/226; 702/69; 324/750, 755, 759, 763, 324/764

See application file for complete search history.

(56) References Cited

U.S. PATENT DOCUMENTS

| | | | |
|---|---|---|---|
| 4,660,197 | A | 4/1987 | Wrinn et al. |
| 5,604,751 | A | 2/1997 | Panis |
| 5,673,272 | A | 9/1997 | Proskauer et al. |
| 5,938,780 | A | 8/1999 | Panis |
| 6,609,077 | B1 | 8/2003 | Brown et al. |
| 6,819,192 | B2 | 11/2004 | Gauthier et al. |
| 7,401,272 | B1 * | 7/2008 | Birk et al. .......... 714/724 |
| 2004/0260492 | A1 | 12/2004 | Halle et al. |
| 2005/0086016 | A1 | 4/2005 | Viss |
| 2005/0149801 | A1 | 7/2005 | Oshima |
| 2006/0149492 | A1 * | 7/2006 | Guidry .................. 702/117 |

FOREIGN PATENT DOCUMENTS

WO 0212909 2/2002

OTHER PUBLICATIONS

Hong et al. ("An Efficient Random Jitter Measurement Technique Using Fast Comparator Sampling," VLSI Test Symposium, 2005. Proceeding. 23rd IEEE May 1-5, 2005, pp. 123-130).*
Hong, D., "An Efficient Random Jitter Measurement Technique Using Fast Comparator Sampling", May 2005, VLSI Test Symposium 2005, 23rd. p. 123-130.*
Hong et al., "An Efficient Random Jitter Measurement Techinique Using Fast Comparator Sampling", "23rd IEEE VLSI Test Symposium", 2005, pp. 123-130, Publisher: IEEE, Published in: Piscataway, NJ.
"Understanding and Characterizing Timing Jitter", "www.tektronix.com/jitter", 2003, pp. 1-24, Publisher: Tektronix.

* cited by examiner

*Primary Examiner*—Mohammad H Ghayour
*Assistant Examiner*—Sung Ahn
(74) *Attorney, Agent, or Firm*—Fogg & Powers LLC

(57) ABSTRACT

A method of jitter measurement is provided and includes sampling a device-under-test (DUT) output signal, having a repeating pattern, using an asynchronous clock over a desired period of time and mapping the samples onto a single period of the repeating pattern. Each period of the repeating pattern is sampled at least twice. A sampling frequency of the asynchronous clock is based on user inputs. Sampling the DUT signal comprises capturing logical state information representing each edge of a single period of the DUT signal at least once. The method further includes, separating the samples into subsets and mapping the sample subsets onto a single period of the repeating pattern wherein the samples within a particular subset are mapped to a set of times which are in the same order as in which the samples were obtained, processing the samples within each subset independently of samples in other subsets, and combining results of the processed subsets and processing the combined results of the subsets.

39 Claims, 8 Drawing Sheets

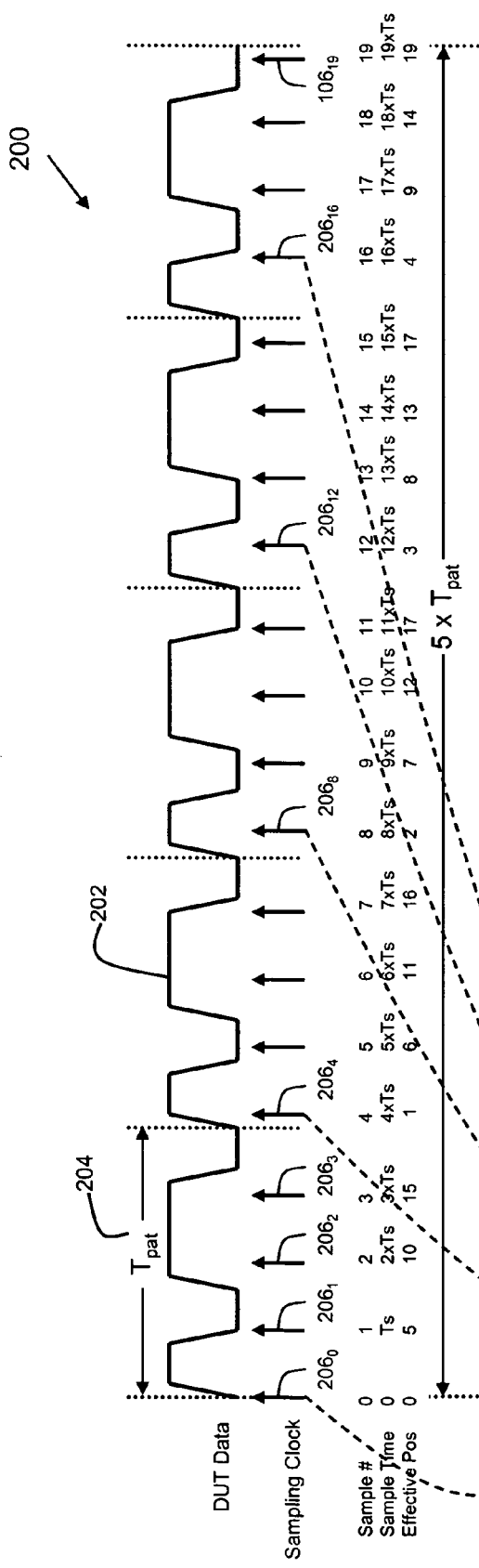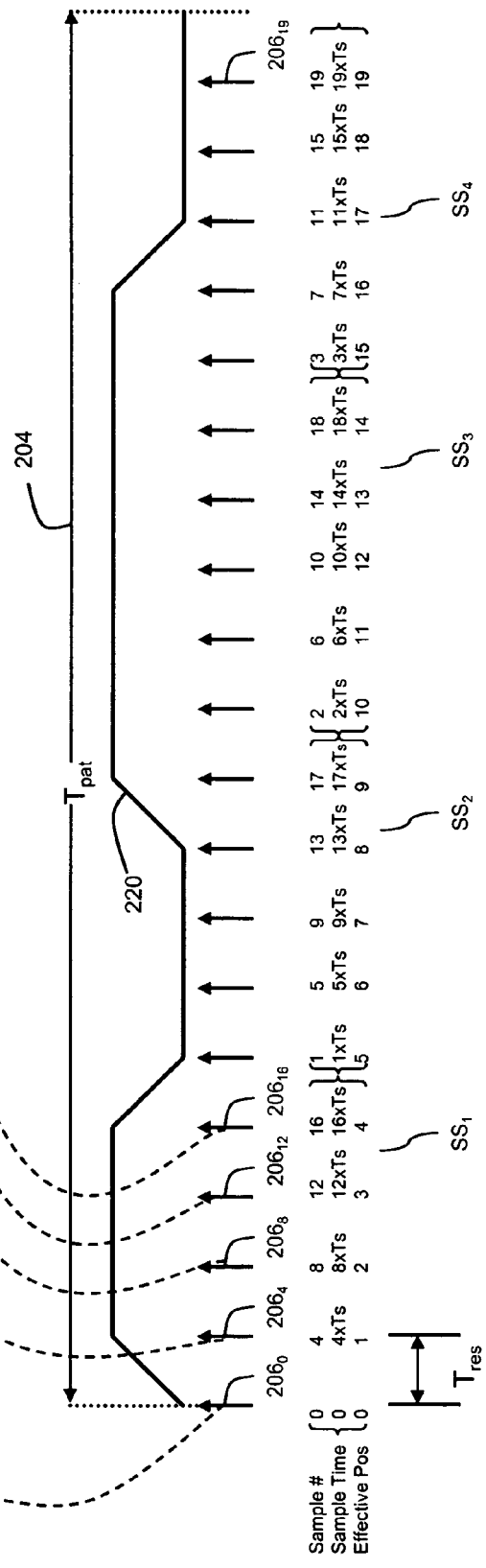
Figure 2a
Figure 2b

JITTER MEASUREMENT ALGORITHM USING LOCALLY IN-ORDER STROBES

CROSS REFERENCE TO RELATED CASE

This application is related to U.S. patent application Ser. No. 12/020,027, (referred to as the '2006 application), with a title "DETERMINING FREQUENCY COMPONENTS OF JITTER" filed on even date herewith, which is incorporated herein by reference in its entirety.

TECHNICAL FIELD

The present invention relates generally to signal testing and in particular to a locally in-order strobing method for jitter measurement of a signal.

BACKGROUND

Automatic test equipment is commonly used by electronics device manufacturers for detecting manufacturing defects. For example, automatic test equipment allows semiconductor device manufacturers to test, on a large volume basis, the functionality of each device sold in the marketplace. The tester drives signals to and detects signals from a device-under-test (DUT) and evaluates the detected results to expected values. Timing jitter degrades electrical systems and the push to higher data rates and lower logic swings has increased interest and necessity for the measurement and characterization of jitter.

Jitter is a key performance factor in high-speed data communications. Jitter is defined as the misalignment of the significant edges in a sequence of data bits from their ideal positions. Misalignments can result in data errors. Tracking these errors over an extended period of time determines system stability. Jitter can be due to deterministic and random phenomena. Determining the level of these jitter components guides design improvement.

Jitter measurement techniques typically have the ability to measure the timing of significant edges in a data stream. For example, oscilloscopes and digitizers have been used to measure the voltage of a signal at fixed time intervals and to analyze this data to determine edge times. Other examples are time interval analyzers and time stampers. These devices directly measure edge times or the time between a pair of edges. In yet another example, asynchronous strobing comparator techniques are used to measure whether a signal is above or below a threshold at fixed time intervals. Asynchronous strobing comparator techniques use stochastic mathematical techniques on the measurement data to determine characteristics of the edge time. Today there exist two general methods of asynchronous comparator techniques, "In-Order" and "Out-of-order" strobing techniques. Shortcomings exist for both the in-order and out-of-order strobing techniques. For example in-order strobing has low noise immunity and long acquisition times and out-of-order strobing is sensitive to frequency errors, requires a complex setup for measurement and allows limited ability to analyze the frequency characteristics of the signal.

For the reasons stated above, and for other reasons stated below which will become apparent to those skilled in the art upon reading and understanding the present specification, there is a need in the art for improved strobing techniques.

SUMMARY

The above-mentioned problems as well as other problems are addressed by embodiments of the present invention and will be understood by reading and studying the following description.

A method of jitter measurement is provided. The method includes sampling a device-under-test output signal using an asynchronous sampling clock over a desired period of time. The DUT output signal has a repeating pattern and each period of the repeating pattern is sampled at least twice. A sampling frequency of the asynchronous sampling clock is based on user inputs. Sampling the DUT output signal comprises capturing logical state information representing each edge of a single period of the DUT output signal at least once. The method further includes mapping the samples onto a single period of the repeating pattern. The method further includes separating the samples into one or more sample subsets wherein each sample subset contains samples that have effectively walked across the DUT output signal in order, processing the samples within each subset independently of samples in other subsets and combining results of the processed subsets and processing the combined results of the subsets.

BRIEF DESCRIPTION OF THE DRAWINGS

The present invention will be more easily understood and further advantages and uses thereof more readily apparent, when considered in view of the description of the preferred embodiments and the following figures in which:

FIG. 2a is a graphical illustration of one embodiment of signal strobe measurement using a walking strobe (locally-in-order strobing) according to the teachings of the present invention.

FIG. 2b is a graphical illustration of a locally-in-order strobing of the signal strobe measurement of FIG. 2(a) in one embodiment of the present invention.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Embodiments of the present invention provide methods and systems for improved signal strobing techniques. In one embodiment, the signal strobing techniques are used for performing jitter measurements with reduced acquisition times over current strobing techniques. Embodiments of the present invention provide systems and methods to overcome short comings of current strobing techniques and improved frequency analysis.

Embodiments of the present invention are based on asynchronous strobing techniques. In one embodiment, an asynchronous strobing method uses a strobe that appears to walk across an output signal of a device-under-test (DUT). The DUT signal waveform has a repeating pattern and a sample is taken every time Ts over a repeating pattern of the signal waveform. Ts=(M×Tpat+Tres)/N, where N is an integer>1 and M is an integer≧1. Tpat is the period of time for a single pattern of the DUT waveform to occur. Tres is the effective sampling resolution.

The methods of undersampling are described as "Walking Strobe" because an asynchronous clock is used to describe characteristics of a signal under test. The signal under test must have a repetitive pattern. The asynchronous nature of the strobe causes it to appear to walk across the test signal. As a result, even though the actual samples will be taken over a time period many times larger than that of the test pattern (Tpat), they can be mapped to "effective times" all within Tpat. The samples are analyzed in M sub-sequences called "Strobe Subsets." Once mapped onto a single period Tpat of the DUT waveform, the strobes for a given strobe subset are locally in-order. Locally in-order means that the strobes within a particular subset can be mapped to a set of times which are spaced by Tres and in the same order as in which the strobes were obtained. This results in a number of strobe subsets each comprised of locally-in-order strobes containing logical state information about a portion of the DUT output waveform. This aquired data is used to determine characteristics of the DUT output waveform such as random jitter, data dependent jitter and total jitter.

Figures 1A, 1B:
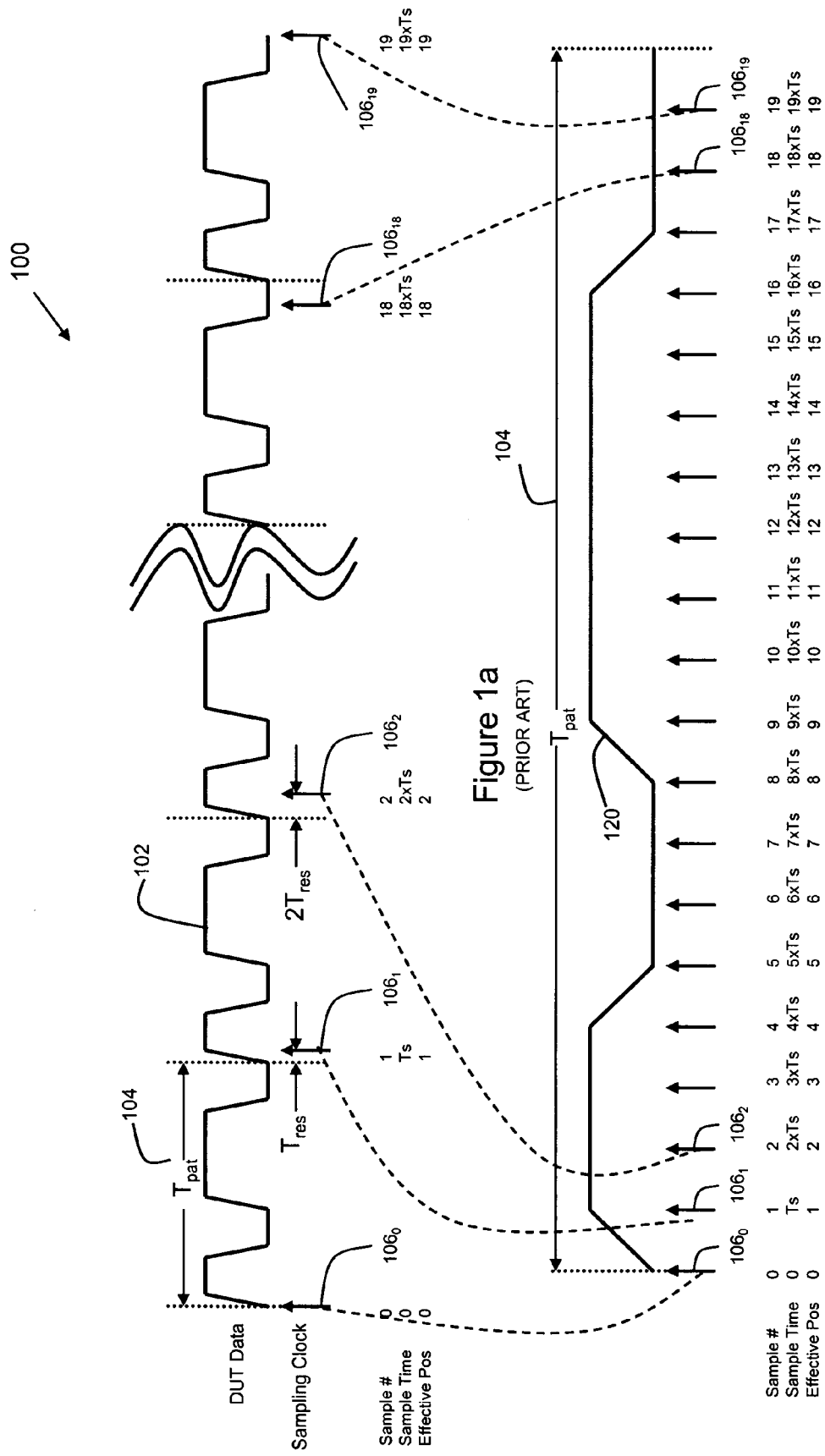
FIG. 1a is a graphical illustration of one embodiment of signal strobe measurement using a walking strobe according to the teachings of the prior art.
FIG. 1b is a graphical illustration of an in-order strobing of the signal strobe measurement of FIG. 1(a) according to the teachings of the prior art.

FIG. 1a is a graphical representation of an undersampled DUT output signal, shown generally at 100. Graph 100 includes a representation of DUT signal 102 being sampled at time intervals Ts by strobes $106_0$ through $106_{19}$ over twenty periods of Tpat 104. Due to space issues on the page that FIG. 1a is illustrated, it is noted that only 5 of the 20 periods of Tpat are shown in FIG. 1a. In this embodiment, it takes 20×Ts to acquire the data and Ts=(Tpat+Tres).

FIG. 1b is a graphical representation of in-order strobing, and each of the 20 periods of DUT signal 102 and strobes $106_0$ through $106_{19}$ from FIG. 1a are overlaid on top of one another, respectively. A single period Tpat of DUT signal 120 is shown expanded with each strobe $106_0$ through $106_{19}$ spaced at Tres.

FIG. 2a is a graphical representation of an undersampled DUT signal, shown generally at 200, according to one embodiment of the present invention. A locally-in-order method of undersampling is applied and a "walking strobe" is utilized. In this embodiment, the acquisition of data is four times as fast as the acquisition of data for the DUT shown in FIG. 1a. Graph 200 includes a representation of a DUT signal 202 being sampled at time intervals Ts by strobes $206_0$ through $206_{19}$ over five periods of Tpat 204. In this embodiment, it also takes 20×Ts to acquire the data but Ts is now 4 times shorter where Ts=(Tpat+Tres)/4. As a result, it only requires 5×(Tpat+Tres) to acquire the data versus 20×(Tpat+Tres) for the acquisition of data with respect to FIG. 1a.

FIG. 2b is a graphical representation of the five periods of DUT signal 202 from FIG. 2a overlaid on top of one another, respectively. A single period Tpat 204 of DUT signal 202 is shown with each strobe $206_0$ through $219_{19}$ spaced at approximately Tres. In this embodiment, subsets of strobes are grouped for further analysis. In this example, four subsets of 5 strobes are defined. Subset 1 ($SS_1$) includes samples $206_0$, $206_4$, $206_8$, $206_{12}$ and $206_{16}$, from sample numbers 0, 4, 8, 12 and 16, subset 2 ($SS_2$) includes samples $206_1$, $206_5$, $206_9$, $206_{13}$ and $206_{17}$ from sample numbers 1, 5, 9, 13 and 17, subset 3 ($SS_3$) includes samples $206_2$, $206_6$, $206_{10}$, $206_{14}$ and $206_{18}$ from sample numbers 2, 6, 10, 14 and 18 and subset 4 ($SS_4$) includes samples $206_3$, $206_7$, $206_{11}$, $206_{15}$ and $206_{19}$ from sample numbers 3, 7, 11, 15 and 19. Each subset $SS_1$-$SS_4$ contains samples that are effectively, locally in-order and are each separated by Tres. Moreover, the total acquisition time of the locally-in-order strobing (i.e. the time it took to acquire all the data gathered for the locally-in-order strobing) is close to the total acquisition time to strobe the five periods of the DUT signal since the strobes in the subsets SS1, SS2, SS3 and SS4 interleave each other throughout the five periods required to sample the DUT signal.

In one embodiment, each strobe subset $SS_1$-$SS_4$ overlaps an adjacent strobe subset $SS_1$-$SS_4$. For example, samples of subset $SS_2$ include logical state information representing portions of the DUT signal 202 that overlap samples of adjacent subsets $SS_1$ and/or $SS_3$. In one embodiment, each strobe subset $SS_1$-$SS_4$ includes samples containing logical state information representing at least one edge within a single period Tpat of the DUT signal 202.

A method of sampling is provided where locally in-order strobes are taken for each repetition of test pattern Tpat. The strobes of each strobe subset $SS_1$-$SS_4$ appear to walk across a portion of the pattern. In one embodiment, locally in-order strobing of FIGS. 2a and 2b is applicable to jitter measurement and provides advantages over current methods of strobing for jitter measurement. For example the locally in-order strobing method as described above reduces the time to acquire strobing samples. Typically, the amount of low frequency noise detected by a measurement increases as the time to perform that measurement increases. Since locally in-order sampling generally takes less measurement time than in-order sampling, it is less susceptible to low frequency noise.

Since the strobes for a given strobe subset are locally in-order, they are not subject to many of the problems associated with out-of-order sampling. The acquisition takes the reduced time of out-of-order sampling as more than one strobe is taken for each repetition of the test pattern. Each strobe subset is analyzed in-order and the results are combined to provide results for the entire pattern. Using the locally in-order strobing and analysis techniques achieves the benefits of in-order and out-of-order strobing techniques without problems indicative of either technique.

FIGS. 2a and 2b are meant for illustration and it is understood that any number of strobes may be utilized to obtain logical state information representing the DUT output signal 202 or portions thereof.

In some embodiments of the present invention, acquisition time is either increased or decreased to change the frequency content of the measurement.

Figure 3A:
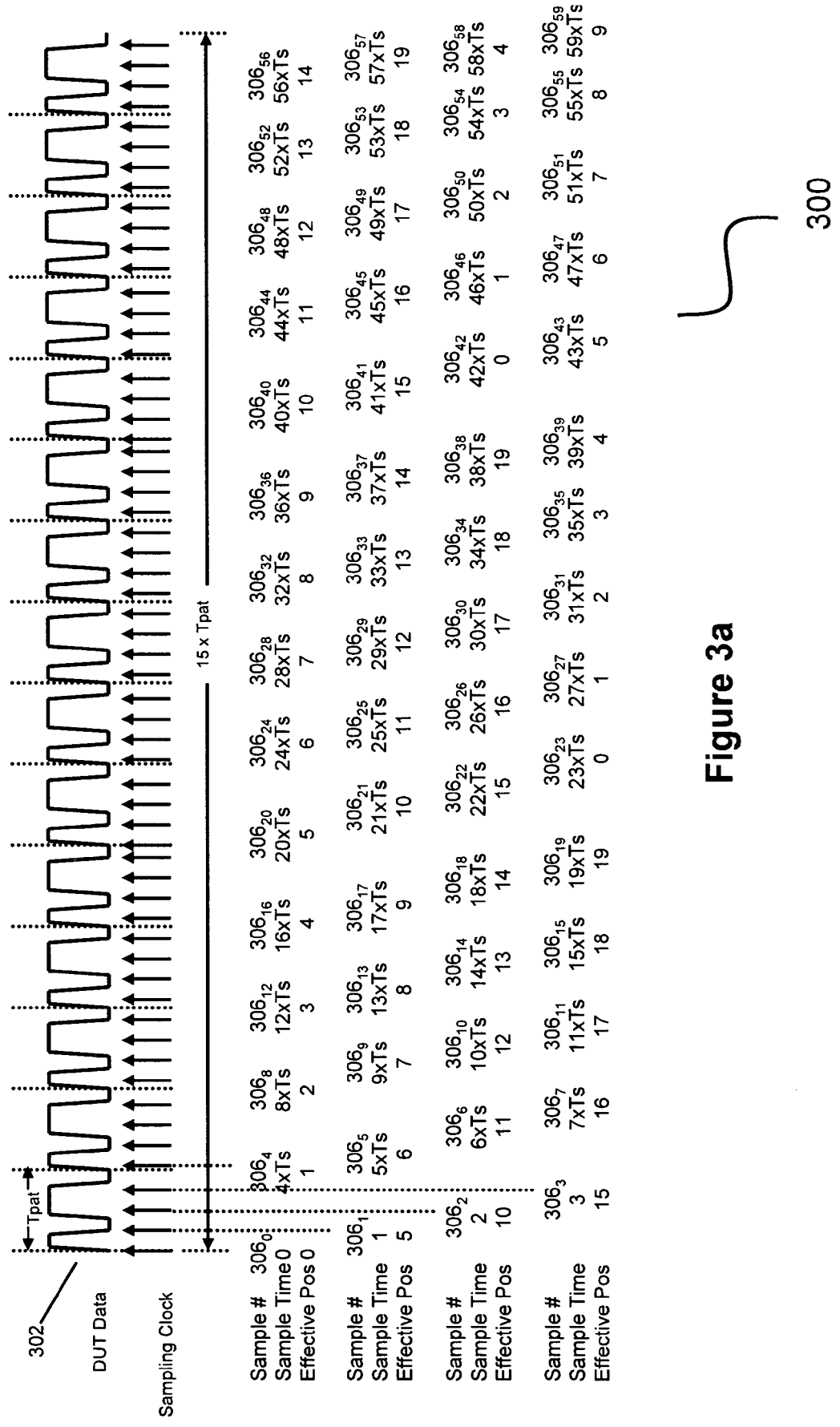
FIG. 3a is a graphical illustration of another embodiment of a signal strobe measurement using a walking strobe (locally-in-order strobing) according to the present invention.

FIG. 3a is a graphical illustration of another embodiment of an undersampled DUT waveform, shown generally at 300, according to the present invention. A locally-in-order method of undersampling is applied and a "walking strobe" is utilized. In this embodiment, the acquisition of data includes three times as many samples as the acquisition of data for the DUT shown in FIG. 2a.

Figure 3B:
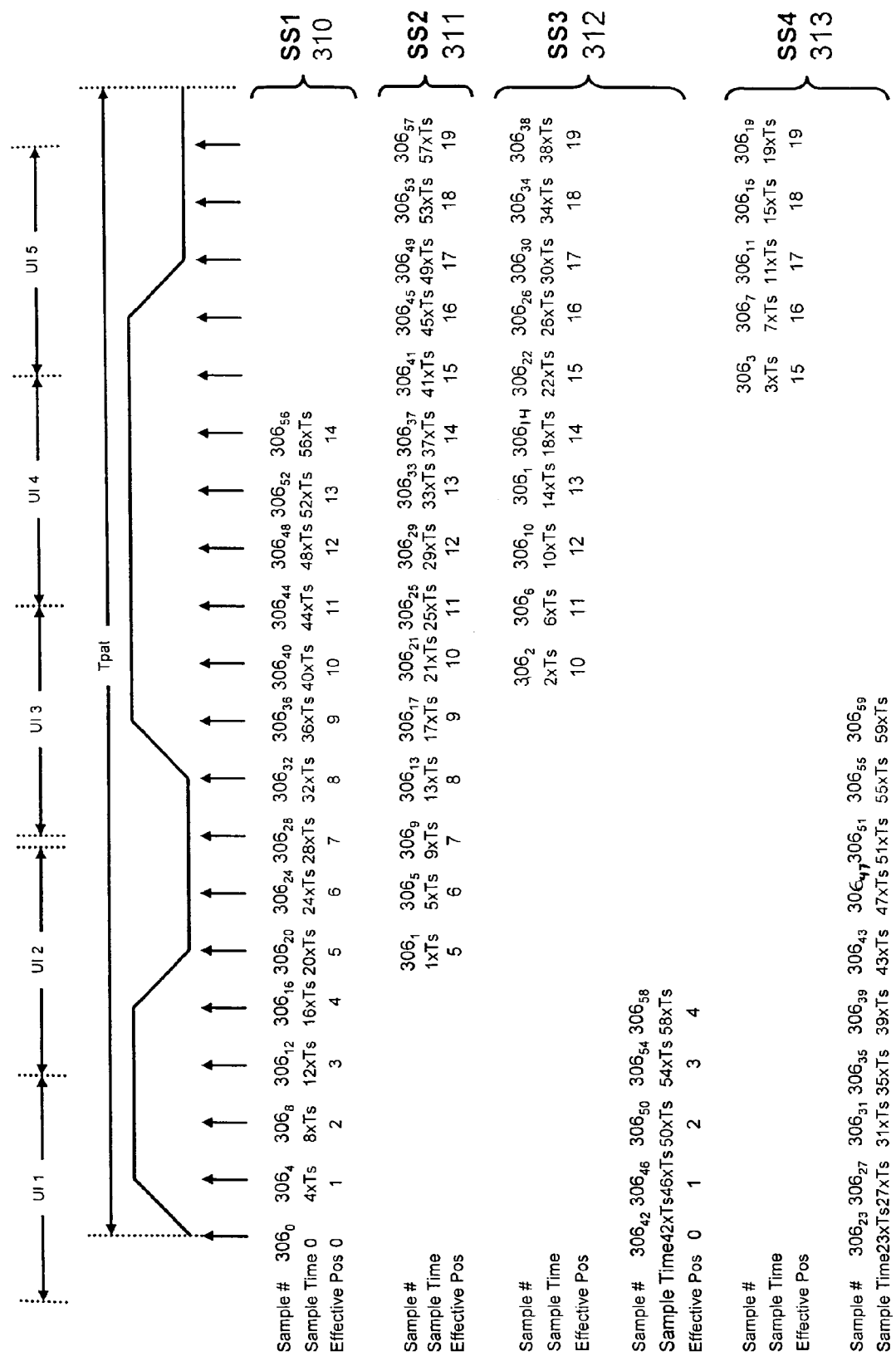
FIG. 3b is a graphical illustration of a locally-in-order strobing of the signal measurement of FIG. 3(a) in one embodiment of the present invention.

FIG. 3b is a graphical representation of five periods of DUT signal 302 from FIG. 3a overlaid on top of one another, respectively. A single period Tpat of DUT signal 302 is shown with each strobe $306_0$ through $319_{19}$ spaced at approximately Tres. In this embodiment, logical state information representing each edge of DUT waveform 302 has been captured by three different sample regions. For example, strobes $306_{32}$ and $306_{36}$ in sample region 1 (310), strobes $306_{13}$ and $306_{17}$ in sample region 2 (311), and strobes $306_{55}$ and $306_{59}$ in sample region 4 (313) capture logical state information representing part of unit interval (UI) 3 and as a result, the effective edge within unit interval 3 has been captured by three sample regions.

Extra samples taken in each sample region 310-313 improves the measurement three ways. First, the overlap in sample regions reduces the risk that an effective edge occurs at the intersection of two sample regions and is consequently not captured by either. Second, the increased number of samples reduces the effect of errors in a few samples. Third, as long as more than one instance of a pattern edge is captured, the measured time of the pattern (Tpat) can be compared to the pattern's expected time. The ratio between measured and expected is used to reduce errors caused by strobe frequency errors and DUT drift.

The method of locally in-order sampling is adaptable to capture logical state information (high or low) of transition regions and/or unit intervals as many times as desired or needed by the user for analysis. It is understood that although FIG. 3b is illustrated with overlapping sample regions that capture logical state information about each unit interval of Tpat three times that any amount of capture is possible. In one embodiment, logical state information about each edge of Tpat is captured only once. In one embodiment, each sample region includes logical state information about an associated transition region plus a portion of the bounding stability regions of the transition region. In one embodiment, the sample region overlap is sufficient to capture logical state information about approximately 0.25 unit intervals of stability regions on each side of the transition region. In some embodiments of the present invention, acquisition time is decreased to reduce the time required to perform the measurement at the expense of improved accuracy.

Figure 4:
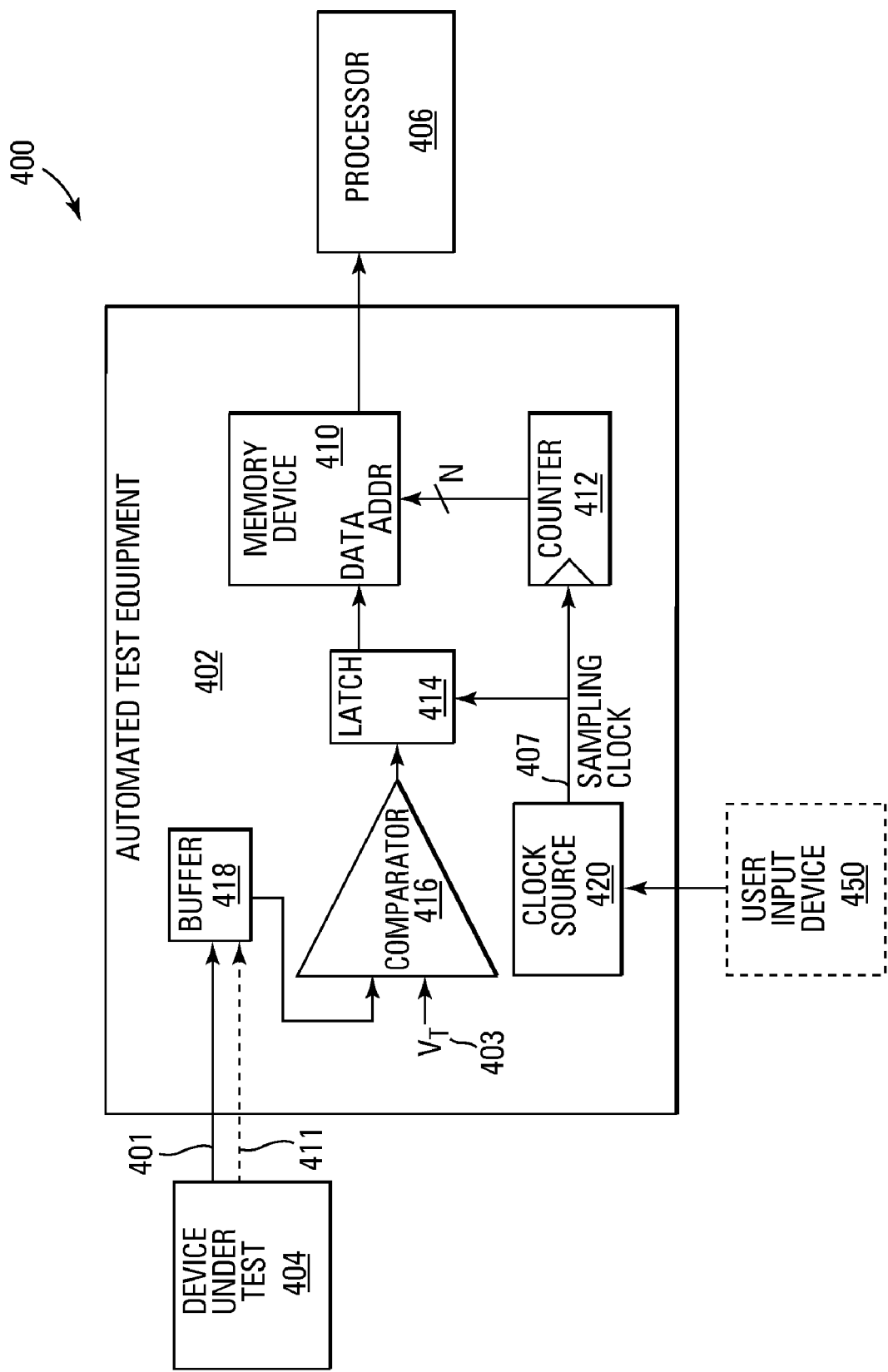
FIG. 4 is a block diagram of one embodiment of a system for strobing signals according to the teachings of the present invention.

FIG. 4 is a block diagram of a locally in-order strobing system, shown generally at 400, according to one embodiment of the present invention. System 400 includes automated test equipment 402 that receives one or more output signals from a device-under-test 404 and provides an output 405 to a processor 406 for analysis. In one embodiment, ATE 402 includes buffer 418 that feeds a buffered DUT output signal 401 to comparator 416. In one embodiment, buffer 418 is a differential buffer and receives differential data from DUT 404 via output signals 401 and 411. The one or more output signals are buffered and the output buffered signal is compared to a reference signal $V_T$ (an expected signal) to determine if the DUT performed as expected. In one embodiment, $V_T$ is a threshold representing the edge transition voltage. An output of comparator 416 is representative of the logical state of the DUT's output waveform and is fed into latch circuit 414 for sampling of the waveform based on sampling clock 407 produced by source clock 420. Sampling clock 407 is fed to counter 412 and latch 414 and samples of the DUT waveform are obtained. The samples are stored in memory device 410 for transmission to processor 406 for further analysis.

In one embodiment, clock source 420 is programmed to strobe the DUT waveform based on device specification and user inputs. User inputs are specific to the DUT and the desired signal information required. In one embodiment, ATE 402 further includes a user input device 450 that is either integral or remotely coupled to ATE 402. In one embodiment, software to perform locally in-order strobing resides within system 400 and utilizes user inputs received from user input device 450 to calculate and setup system 400 for jitter characterization. In one embodiment, user inputs include one or more of the bit period or unit interval of the jitter measure pins, jitter measure pins, the number of bits per pattern, the target effective sampling resolution and the number of pattern repetitions. The jitter measure pins indicate which DUT transmit pins will be measured. The bits per pattern are the number of bits of the repeating pattern Tpat. The target effective sampling resolution (Tres) determines the effective sampling frequency. The number of pattern repetitions indicates how many times to effectively walk across the repeating DUT waveform pattern.

In one embodiment, processor 406 uses the logical state information representative of portions of the DUT output waveform, the user inputs and device data to calculate random jitter Rj of the DUT waveform. In one embodiment, user inputs received from user input device 450 further include parameters which indicate measurement bandwidths. In one embodiment, software to perform locally in-order strobing resides within system 400 and utilizes user inputs received from user input device 450 to calculate and setup system 400 for multiple jitter captures, each with a different bandwidth. In one embodiment, processor 406 uses the sampling strobe subsets/regions to perform eye measurement. The locally in-order strobing method is used and multiple captures are performed at different Vod level settings to create an eye diagram. In one embodiment, the Vod level settings are at 20, 50 and 80 percent.

In operation, the DUT output signal(s) 401 and 411 have a repeating pattern and are sampled using a walking strobe. The clock period of sampling clock 407 is set at a fraction of a time greater than the period of the repeating pattern so that each clock samples the pattern effectively the fraction of time later or earlier than a previous sample. In one embodiment, for example, the fraction of time is a picosecond and the period of the repeating pattern output signal is a millisecond.

Figure 5A:
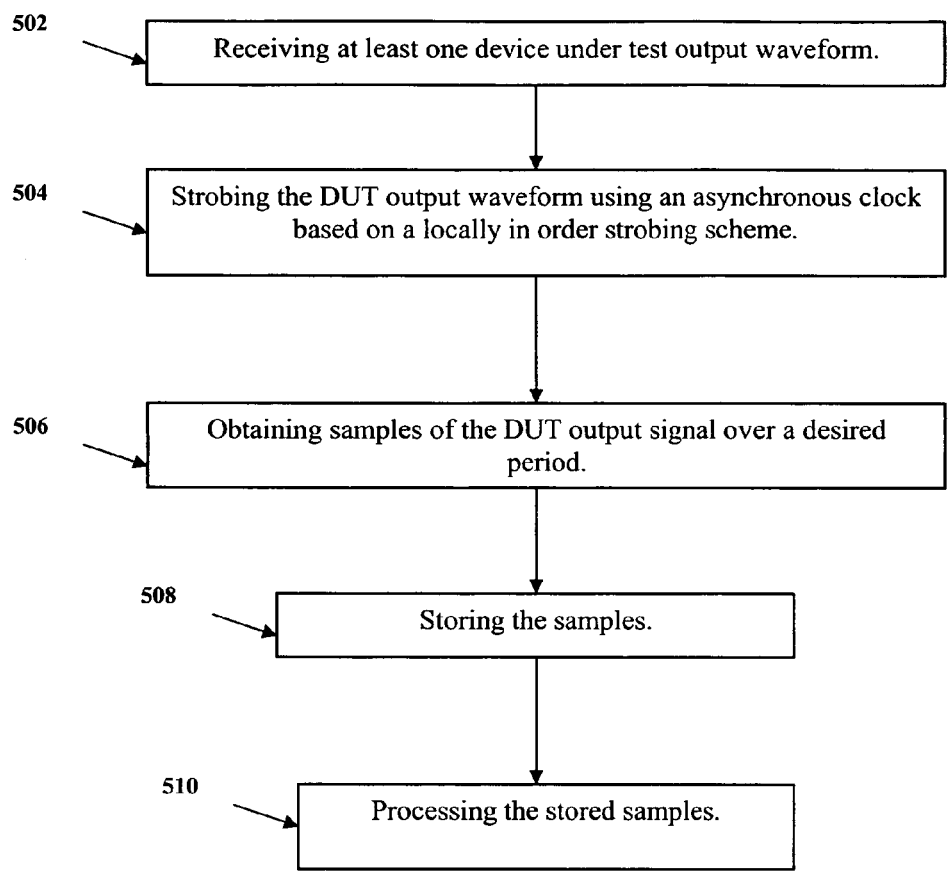
FIG. 5a is a flow chart for one embodiment of a method of locally in-order strobing according to the teachings of the present invention.

FIG. 5a is a flow chart for a locally in-order strobing technique, shown generally at 500, according to one embodiment of the present invention. The method comprises asynchronously digitally undersampling a device-under-test (DUT) output waveform. The method begins at 502 and receives one or more DUT waveforms. The DUT waveform has a repeating pattern. Based on user inputs, the method strobes the DUT waveform using an asynchronous clock at 504 using a locally in-order strobing scheme. The method proceeds to 506 and obtains samples of the signal over a desired period. The asynchronous nature of the strobes causes them to appear to walk across the DUT waveform. The method obtains more than one sample per period Tpat of the DUT waveform. Each sample is part of a sample subset with samples that are taken at a desired period of (M×Tpat+Tres) wherein Tres is a fraction of Tpat and M is an integer≧1. The method proceeds to 508 and stores digital representations of the samples. The method proceeds to 510 and processes the stored samples.

In one embodiment, the locally in-order strobing scheme comprises strobing each edge of one period Tpat of the DUT waveform at least once and including a portion of stable regions bounding each edge. The locally in-order strobing scheme is based on user inputs. In one embodiment, user inputs include one or more of the bit period or unit interval of the jitter measure pins, jitter measure pins, the number of bits per pattern, the target effective sampling resolution Tres and the number of pattern repetitions. The jitter measure pins indicate which DUT transmit pins will be measured. The bits per pattern is the number of bits of the repeating pattern Tpat. The target effective sampling resolution (Tres) determines the effective sampling frequency. The number of pattern repetitions indicates how many times to effectively walk across the repeating DUT waveform pattern.

In one embodiment, processing the stored samples includes mapping the samples to "effective times" within a single period Tpat of the DUT. Once the samples are remapped each sample within an associated sample region is approximately separated from an adjacent sample by Tres. In one embodiment, processing includes calculating jitter that includes one or more of random jitter, deterministic jitter and total jitter. In one embodiment, to analyze jitter, each sample region will be analyzed separately to find all average edge positions occurring within a sample region/subset.

Figure 5B:
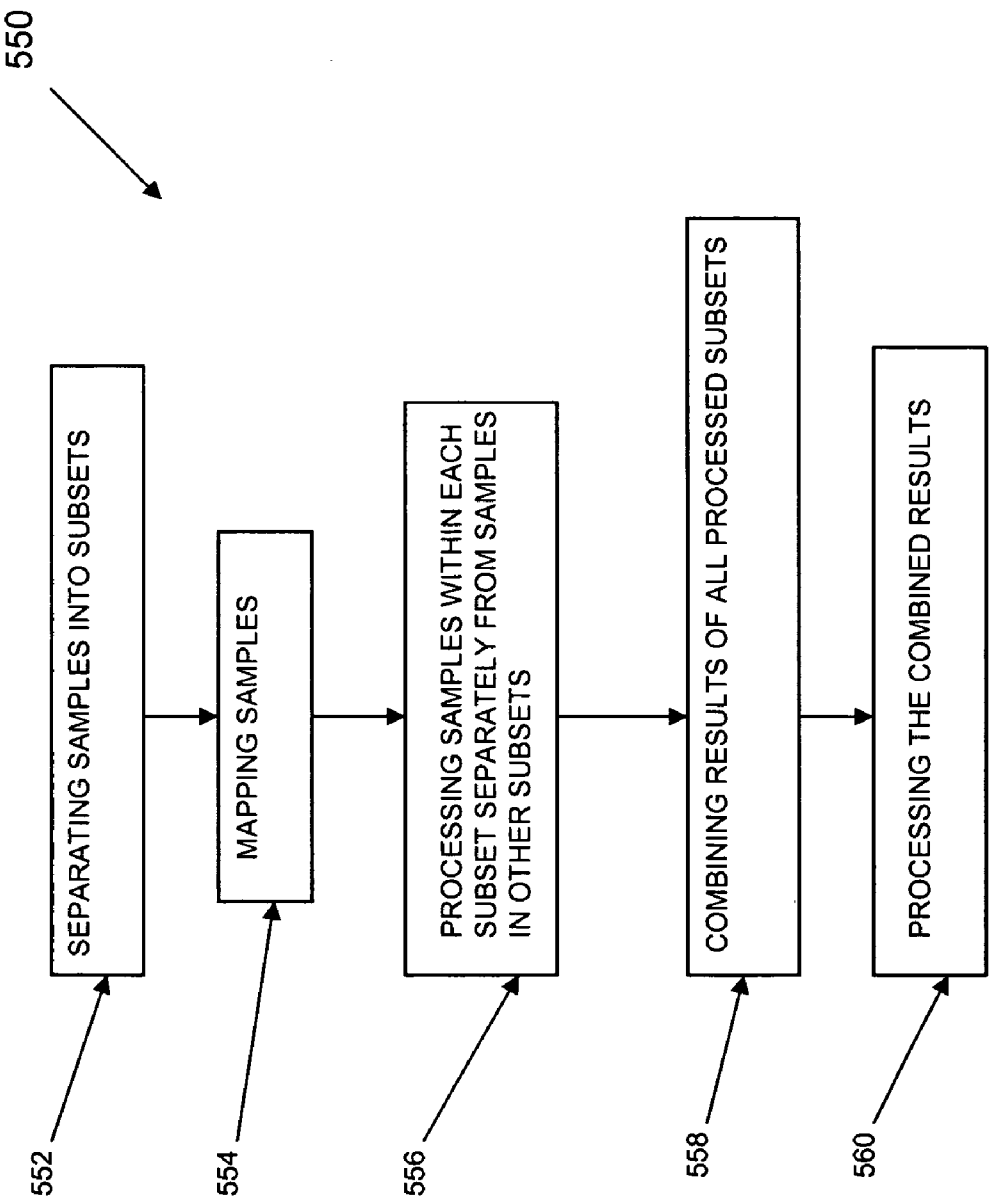
FIG. 5b is a flow cart illustrating the processing information from a local in-order strobing of one embodiment of the present invention.

Furthermore the processing of the stored samples in embodiments of the present invention is further illustrated in the flow chart, shown generally at 550, of FIG. 5b. As illustrated, the samples at 552 are separated into subsets. At 554, the samples are mapped into a single period of a repeated pattern. In particular, samples within a particular subset are mapped to a set of times which are in the same order as in which the samples were obtained. The samples in each subset are then processed separately from the samples in other subsets at 556. The results of each processed subset, at 558, are combined. The combined results are then processed at 560.

In one embodiment, the method of locally in-order strobing is used to determine if characteristics of the DUT waveform conform to voltage versus time requirements of the DUT. These requirements may consist of risetime, falltime, or template. In this embodiment, the locally-in-order strobing is repeated a plurality of times, resulting in multiple segments of waveform data. Each time, the DUT output signal is compared to a reference signal $V_T$ (an expected signal) set to a different voltage. The waveform segments may be adjacent ones or more widely spaced samples of the DUT signal. In another embodiment, the DUT is strobed at multiple levels at the same time by duplicating the circuitry. In operation, the multiple segments of waveform data are processed to determine characteristics such as earliest, latest, and average edge positions at each voltage level. The average positions of an edge at two voltage levels can be used to determine that edge's risetime or falltime. The earliest and latest times that each edge occurs can be used to determine whether the DUT output waveform's edges fit within a required template or eye diagram.

In one embodiment, the locally in-order strobing scheme comprises strobing each edge of one period Tpat of the DUT waveform at least once and including a portion of stable regions bounding each edge. The method obtains more than one sample per period Tpat of the DUT waveform. Each sample is part of a sample subset with samples that are taken at a desired period of Tpat×M+Tres wherein Tres is a fraction of Tpat and M is an integer≧1.

In one embodiment, processing the stored samples includes mapping the samples to "effective times" within a single period Tpat of the DUT. Once the samples are mapped each sample is separated from an adjacent sample by Tres. In one embodiment, processing includes calculating jitter that includes one or more of random jitter, data dependent jitter, deterministic jitter and total jitter. In one embodiment, to analyze jitter, each sample region will be analyzed separately to find all average edge positions occurring within a sample region/subset.

Figure 6:
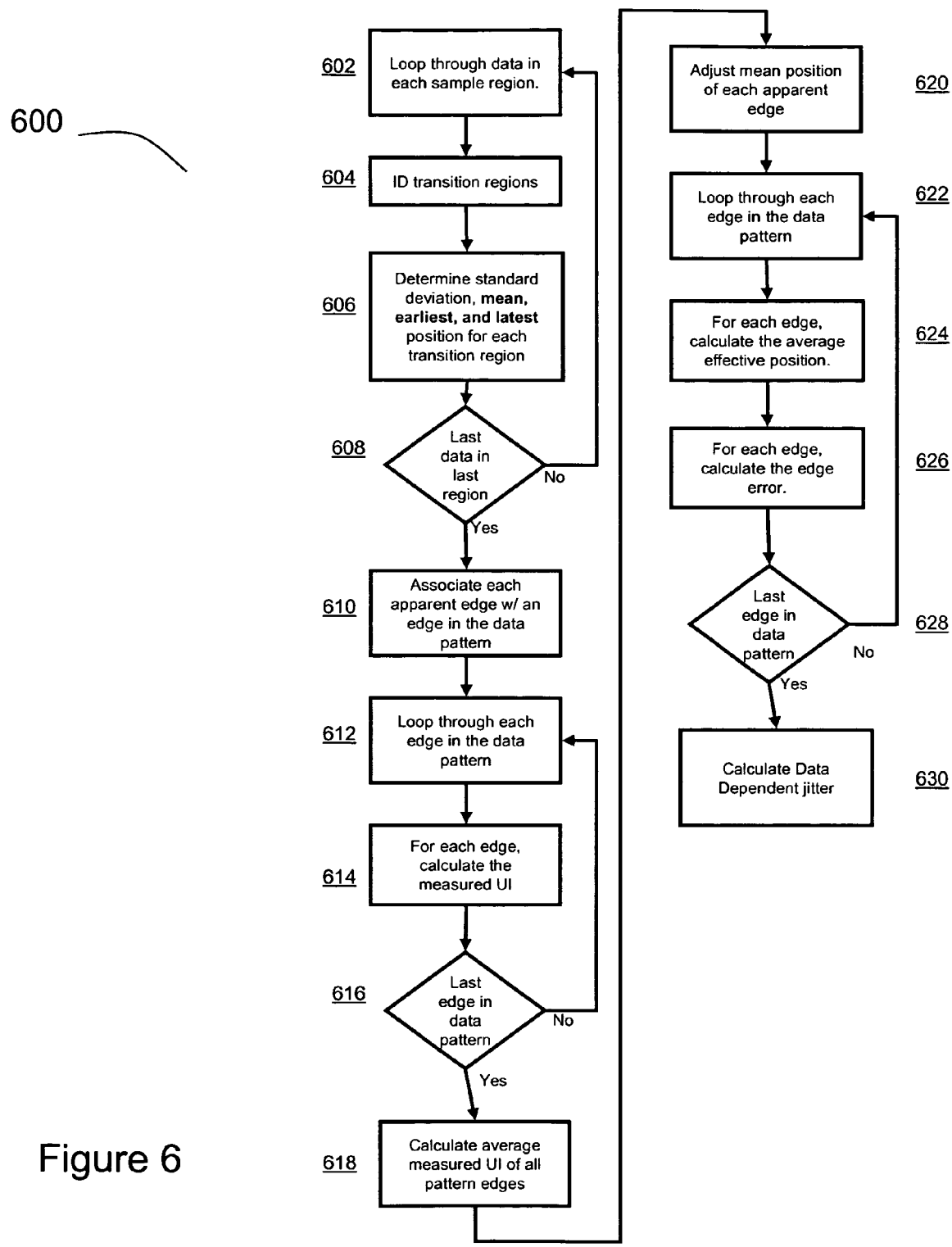
FIG. 6 is a flow chart for one embodiment of a method of locally in-order strobing according to the teachings of the present invention.

FIG. 6 is a flow chart for determining jitter in a waveform, shown generally at 600, according to one embodiment of the present invention. First at 602 the data within a sample region is looped through one sample at a time, starting at the first bit sampled and ending at the last bit sampled. Most of the data will consist of logical Lows or Highs surrounded by data of the same state. At 604, transition regions within the data are identified. The transition regions are identified as a set of data containing a mixture of zeros and ones like the example in FIG. 2d of the '2006 application incorporated herein. Generally, a rule is needed to define what separates one transition region from another. For example, when the data in a waveform contains the equivalent of unit interval (UI)/4 of steady state, any different data will be considered the start of a new transition region. Moreover, a general rule is also needed to ignore data that may indicate a transition region at the beginning or the end of a sample region.

Since each transition region indicates an apparent edge, at 606 calculations are performed to determine the standard deviation of each transition region. For practical purposes, the standard deviation is the random jitter although it may contain negligible amounts of period jitter and the like. At 606, calculations are also performed to determine the mean position of each apparent edge, as well as the earliest and latest times that apparent edge occurred. The method proceeds to 608 and determines if the last data in the last region has been looped through. If yes, the method proceeds to 610. If the last data in the last region has not been looped through, the method proceeds to 602 and begins again.

The method proceeds to 610 where each apparent edge in each sample region is associated with an edge in the data pattern. Generally, a rule is needed because edges do not occur at their ideal times. For example, if the first apparent edge found is considered to be at time 0 and associated with pattern edge 0, another apparent edge may be associated with pattern edge N when that edge effectively occurs within the range N(UI)+/−0.5UI.

Drift and/or frequency differences may occur between the expected data rate and the DUT's data rate. Errors may also exist in the sampling rate. These issues are dealt within steps 612-620 of flow chart 600. Drift and/or frequency differences manifest themselves as an error that increases at a constant rate through the acquisition of the measurement. Therefore, if the rate at which the errors increase can be determined as a function of time, the error can be removed from each apparent edge's position by calculating the error associated with the time at which that edge was acquired. At 612-616 the measured UI is calculated for each pattern edge based on all the apparent edges associated with that pattern edge. In one embodiment, step 614 is performed using a least squares linear regression methodology. The method proceeds to 618 where the measured UI of all pattern edges is calculated as the average of the measured UIs calculated for each pattern edge. The rate at which the errors increase can be determined by the ratio between the expected UI and the measured UI. The method proceeds to 620 and the mean position of each apparent edge is adjusted based on the determined ratio and the number of UIs that occurred between the beginning of the acquisition and the time that apparent edge was acquired. Locally in-order strobing is unlike out-of-order sampling in that out-of-order sampling acquires the information to determine an apparent edge's mean position at a range of times spread throughout the measurement. When data from very different acquisition times is merged to generate the mean effective position of an apparent edge, as is the case with out-of-order sampling calculations, it is not possible to determine a time at which that edge was acquired. Consequently, the rate at which errors increase can neither be established nor applied to apparent edge positions.

The method proceeds to 622-628 and determines the average position and error of each pattern edge. At 624, the average position of each pattern edge is calculated as the average position of all the apparent edges associated with that pattern edge. At 626 each pattern edge's error is calculated as the difference between the edge's mean effective position and its ideal position. The method proceeds to 630 and computes the Data Dependent jitter as the difference between the most positive pattern edge error and the most negative pattern edge error.

Embodiments of the present invention provide systems and methods of locally in-order strobing that has a fast sampling frequency and as a result minimizes the acquisition time and rejects low-frequency jitter such as periodic jitter.

As stated above, the methods and techniques described here are implemented by a locally in-order strobing system. Embodiments of devices that make up the locally in-order strobing system may be implemented in digital electronic circuitry, or with a programmable processor (for example, a special-purpose processor or a general-purpose processer such as a computer firmware, software, or in combinations of them). Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed application-specific integrated circuits (ASICs).

Although specific embodiments have been illustrated and described herein, it will be appreciated by those of ordinary skill in the art that any arrangement, which is calculated to achieve the same purpose, may be substituted for the specific embodiments shown. This application is intended to cover any adaptations or variations of the present invention. Therefore, it is intended that this invention be limited only by the claims and the equivalents thereof.

What is claimed is:

1. A method of locally in-order strobing, comprising:
   receiving at least one device-under-test (DUT) output signal, wherein the DUT output signal has a repeating pattern;
   sampling the DUT output signal using an asynchronous sampling clock, wherein each period of the repeating pattern is sampled at least twice;
   wherein a sampling frequency of the asynchronous sampling clock is based on one or more user inputs;
   wherein sampling the DUT output signal comprises capturing logical state information representing each edge of a single period of the DUT output signal at least once;
   separating the samples into subsets, a first subset comprising a first sample from each period of the repeating pattern and a second subset comprising a second sample from each period of the repeating pattern;
   mapping the samples onto a single period of the repeating pattern, wherein the first subset maps to a first portion of the single period and the second subset maps to a second portion of the single period, wherein the samples within a particular subset are mapped to a set of times which are in the same order as in which the samples were obtained;
   processing the samples within each subset independently of samples in other subsets;
   combining results of the processed subsets; and
   processing the combined results of the subsets.

2. The method of claim 1, wherein the one or more user inputs comprises a number of bits per one period of the repeating pattern, a length of a single bit period, a target effective sampling resolution, a number of times to effectively walk across the repeating pattern and jitter measure pins to be sampled.

3. The method of claim 1, wherein sampling the DUT output signal further comprises capturing logical state information representing each edge and a portion of adjacent stable regions at least once.

4. The method of claim 1, wherein each sample within the single period of the DUT output signal belongs to a different sample subset.

5. The method of claim 1, further comprising storing the samples in memory.

6. The method of claim 1, further comprising processing the stored samples.

7. The method of claim 1, wherein an effective position of samples of a single subset overlap samples of adjacent subsets.

8. The method of claim 1, further comprising calculating jitter of each edge based on samples of an associated subset.

9. The method of claim 1, further comprising calculating one or more of random jitter, data dependent jitter, and total jitter for the DUT output signal.

10. The method of claim 9, further comprising calculating frequency components of the jitter for the DUT output signal.

11. The method of claim 1, further comprising reducing the risk that an effective edge occurs at an intersection of two sample subsets and is not captured by either subset by increasing the number of samples within each sample subset.

12. The method of claim 1, further comprising reducing the effect of errors in a few samples by increasing the number of samples.

13. The method of claim 1, further comprising reducing errors caused by strobe frequency errors and DUT drift by determining a rate at which errors increase as a function of time and applying these determined errors as a factor affecting measurement results.

14. The method of claim 1, further comprising reducing the time required to perform a measurement by decreasing the number of samples obtained.

15. A method of jitter measurement, comprising:
sampling a device-under-test (DUT) output signal using an asynchronous sampling clock over a desired period of time;
wherein the DUT output signal has a repeating pattern and each period of the repeating pattern is sampled at least twice;
wherein a sampling frequency of the asynchronous sampling clock is based on one or more user inputs;
wherein sampling the DUT output signal comprises capturing logical state information representing each edge of a single period of the DUT output signal at least once;
separating the samples into subsets and mapping the samples onto a single period of the repeating pattern wherein the samples within a particular subset are mapped to a set of times which are in the same order as in which the samples were obtained, wherein a first subset maps to a first portion of the single period and a second subset maps to a second portion of the single period;
processing the samples within each subset independently of samples in other subsets;
combining results of the processed subsets; and
processing the combined results of the subsets.

16. A method of measuring jitter, comprising:
receiving at least one device-under-test (DUT) output signal, wherein the DUT output signal has a repeating pattern;
receiving a plurality of user inputs;
calculating a sampling frequency based on the user inputs;
sampling the DUT output signal based on the calculated sampling frequency;
mapping the samples onto a single period of the repeating pattern wherein the samples are separated into sample subsets and the time period between each sample in a subset is a fraction of time greater than a period of the repeating pattern so that each sample of a subset is effectively a fraction of time later than the previous sample after mapping the samples onto a single period of the repeating pattern;
processing the samples within each subset independently of samples in other subsets;
combining results of the processed subsets; and
processing the combined results of the subsets.

17. The method of claim 16, wherein the user inputs comprise one or more of number of bits per one period of the repeating pattern, a length of a single bit period, a target effective sampling resolution, a number of times to effectively walk across the repeating pattern and jitter measure pins to be sampled.

18. The method of claim 16, wherein each sample subset includes at least one edge of a single period of the DUT signal.

19. The method of claim 16, wherein each sample subset includes at least one edge of a single period of the DUT signal and a portion of stable regions bounding each edge.

20. The method of claim 16, further comprising storing the samples in memory.

21. The method of claim 20, further comprising processing the stored samples.

22. The method of claim 16, further comprising calculating jitter of each edge based on samples of an associated subset.

23. The method of claim 16, further comprising calculating one or more of random jitter, data dependent jitter, and total jitter for the DUT output signal.

24. The method of claim 16, further comprising determining if characteristics of the DUT output signal conforms to voltage versus time requirements of the device-under-test.

25. The method of claim 24, wherein the characteristics include one or more of an effective edge's risetime and falltime.

26. The method of claim 16, further comprising determining whether edges of the DUT output signal fit within a required template or eye diagram.

27. An automated test equipment system, comprising:
a comparator adapted to receive at least one output signal from a device-under-test and compare the output signal to an expected output signal, wherein the output signal has a repeating pattern;
a clock source adapted to produce a sampling clock based on user inputs; and
a latching circuit adapted to obtain samples of the output signal according to the sampling clock, wherein the samples are separated into sample subsets and the time period between each sample in a subset is a fraction of time greater than a period of the repeating pattern so that each sample of a subset is effectively a fraction of time later than the previous sample after mapping the samples onto a single period of the repeating pattern; and
a processor adapted to process samples within each subset independently of samples in other subsets, the processor further adapted to combine the results of all the processed subsets and process the combined results.

28. The system of claim 27, wherein the user inputs comprise one or more of a number of bits per one period of the repeating pattern, a length of a single bit period, a target effective sampling resolution, a number of times to effectively walk across the repeating pattern and jitter measure pins to be sampled.

29. The system of claim 27, further comprising a memory device adapted to store the sampled data.

30. The system of claim 29, further comprising the processor is adapted to analyze the stored data.

31. The system of claim 30, wherein the processor maps the samples onto a single period of the repeating pattern.

32. The system of claim 30, wherein the processor calculates jitter of each edge of a period of the output signal based on samples of an associated subset.

33. The system of claim 27, wherein logical state information representing each edge within a single period of the output signal is captured at least once.

34. The system of claim 27, wherein logical state information representing each edge and a portion of adjacent stable regions within a single period of the output signal is captured at least once.

35. The system of claim 27, wherein each sample within the single period of the output signal belongs to a different sample subset.

36. The system of claim 30, wherein the processor calculates one or more of random jitter, data dependent jitter, and total jitter for the output signal.

37. The system of claim 30, wherein the processor determines if characteristics of the output signal conforms to voltage versus time requirements of the device-under-test, wherein the characteristics include one or more of an effective edge's risetime and falltime.

38. The system of claim 30, wherein the processor determines whether edges of the DUT output signal fit within a required template or eye diagram.

39. An automated test equipment system, comprising:
- a buffer adapted to receive at least one output signal from a device-under-test, wherein the output signal has a repeating pattern;
- a comparator coupled to an output of the buffer and adapted to compare the buffered output signal to an expected output signal;
- a clock source adapted to produce a sampling clock based on user inputs;
- a latching circuit adapted to obtain samples of an output signal of the comparator according to the sampling clock, wherein the samples are separated into sample subsets and the time period between each sample in a subset is a fraction of time greater than a period of the repeating pattern so that each sample of a subset is effectively a fraction of time later than the previous after ma in the samples onto a single period of the repeating pattern, and
- a processor adapted to process samples within each subset independently of samples in other subsets, the processor further adapted to combine the results of all the processed subsets and process the combined results.

* * * * *